United States Patent
Ando (10) Patent No.: US 7,928,489 B2
(45) Date of Patent: Apr. 19, 2011

(54) SEMICONDUCTOR DEVICE SUITABLE FOR A FERROELECTRIC MEMORY

(75) Inventor: Takashi Ando, Machida (JP)

(73) Assignee: Fujitsu Semiconductor Limited, Yokohama (JP)

( * ) Notice: Subject to any disclaimer, the term of this patent is extended or adjusted under 35 U.S.C. 154(b) by 13 days.

(21) Appl. No.: 12/314,804

(22) Filed: Dec. 17, 2008

(65) Prior Publication Data

US 2009/0140306 A1 Jun. 4, 2009

Related U.S. Application Data

(62) Division of application No. 10/807,327, filed on Mar. 24, 2004, now abandoned.

(30) Foreign Application Priority Data

Oct. 24, 2003 (JP) .................................. 2003-364917

(51) Int. Cl.
*H01L 21/02* (2006.01)
(52) U.S. Cl. ................................ 257/295; 257/E21.664
(58) Field of Classification Search .......... 257/296–300, 257/295, E21.664
See application file for complete search history.

(56) References Cited

U.S. PATENT DOCUMENTS

| 6,656,801 B2 | 12/2003 | Corvasce et al. |
| 6,713,808 B2 | 3/2004 | Wang et al. |
| 2005/0012125 A1* | 1/2005 | Summerfelt et al. ......... 257/295 |

FOREIGN PATENT DOCUMENTS

| JP | 2000349250 A | 12/2000 |
| JP | 2003-92391 A | 3/2003 |

OTHER PUBLICATIONS

Machine Translation of JP2000-349250 (cited by applicant).*
Merriam-Webster Online, www.m-w.com.
Japanese Office Action dated May 25, 2010, issued in corresponding Japanese Patent Application No. 2003-364917 (with partial translation).

* cited by examiner

*Primary Examiner* — Bradley K Smith
*Assistant Examiner* — Amar Movva
(74) *Attorney, Agent, or Firm* — Westerman, Hattori, Daniels & Adrian, LLP (57) ABSTRACT

There is formed a gate electrode (word line) via a gate insulating film on a semiconductor substrate, the gate electrode extending in the direction inclining at an angle of approximately 45 degrees to the extending direction of an element region. The element region is divided into three portions by the two gate electrodes. In each element region portion, two MOS transistors are provided. A bit line is connected to a W plug provided in the central region portion and lower electrodes of two ferroelectric capacitors are connected to other W plugs provided in both end region portions. The extending direction of the bit line inclines approximately 45 degrees to the extending direction of the element region.

4 Claims, 13 Drawing Sheets

SEMICONDUCTOR DEVICE SUITABLE FOR A FERROELECTRIC MEMORY

CROSS-REFERENCE TO RELATED APPLICATIONS

This application is a divisional application of Ser. No. 10/807,327, filed Mar. 24, 2004 which is based upon and claims the benefit of priority from the prior Japanese Patent Application No. 2003-364917, filed on Oct. 24, 2003, the entire contents of which are incorporated herein by reference.

BACKGROUND OF THE INVENTION

1. Field of the Invention

The present invention relates to a semiconductor device suitable for a ferroelectric memory and a manufacturing method thereof.

2. Description of the Related Art

Recently, with the purpose of improving integration, the shape having a practically vertical side surface is expected for a shape of a ferroelectric capacitor for example of the 0.18 μm generation. For this purpose, for example in a simultaneous etching at a high temperature using a hard mask, such a technique is beginning to be employed as etching simultaneously an upper electrode film, a ferroelectric film, and a lower electrode film. As a structure of the hard mask here, a lamination structure using a TEOS film and a TiN film is employed.

However, when employing the high-temperature simultaneous etching in the current process, those scattered substances, which are generated in the course of etching the ferroelectric film, may be deposited on a sidewall of the capacitor after changing their properties. Due to such deposits as exist on the sidewall, a leakage current may sometimes be caused between the upper electrode and the lower electrode. Therefore, it is conventionally designed to remove these deposits in the etching process of the lower electrode.

Meanwhile, the sidewall deposits have an effect of preventing the ferroelectric film from damages. Hence, when the sidewall deposits of the ferroelectric capacitor are completely removed in the manufacturing process of the conventional ferroelectric memory, the ferroelectric film locally suffers substantial heavy damages, making it impossible to obtain desired properties. Accordingly, in the conventional ferroelectric memory, it is impossible to prevent leakage current adequately. A prior art is disclosed for example in Japanese Patent Application Laid-Open No. 2003-092391.

SUMMARY OF THE INVENTION

An object of the present invention is to provide a semiconductor device provided with a ferroelectric capacitor of a structure capable of reducing leakage current adequately while preventing local damages to a ferroelectric film, and a manufacturing method of the same.

In regard to this mutually offsetting relation between the reductions in leakage current obtained by removing the deposits from the sidewall and in etching damages of the ferroelectric film, after diligent efforts to seek for solutions to the previously-mentioned problems, the present inventor has come to the following findings.

Figure 13:
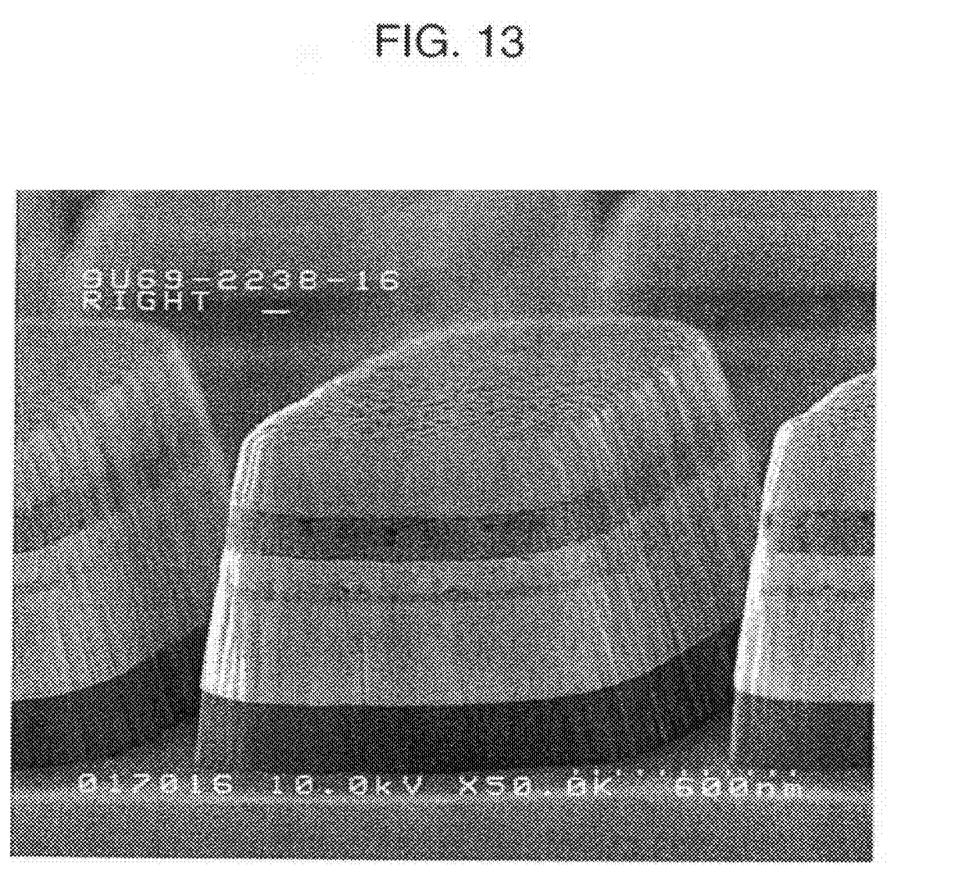
FIG. 13 is a microphotograph showing the ferroelectric capacitor after a high-temperature simultaneous etching.

FIG. 13 is a microphotograph taken via a scanning electron microscope (SEM) by the present inventor, showing a typical view after a simultaneous etching at a high temperature. As shown in FIG. 13, at the longer side of the capacitors, at which the distance between the capacitors are narrower, deposits tend to adhere to the sidewalls, while there is no damage on a capacitor insulating film (ferroelectric film). On the other hand, at the shorter side of the capacitors, at which the distance between the capacitors are wider, deposits do not tend to adhere to the sidewalls, while there are damages on the capacitor insulating film.

Figure 10:
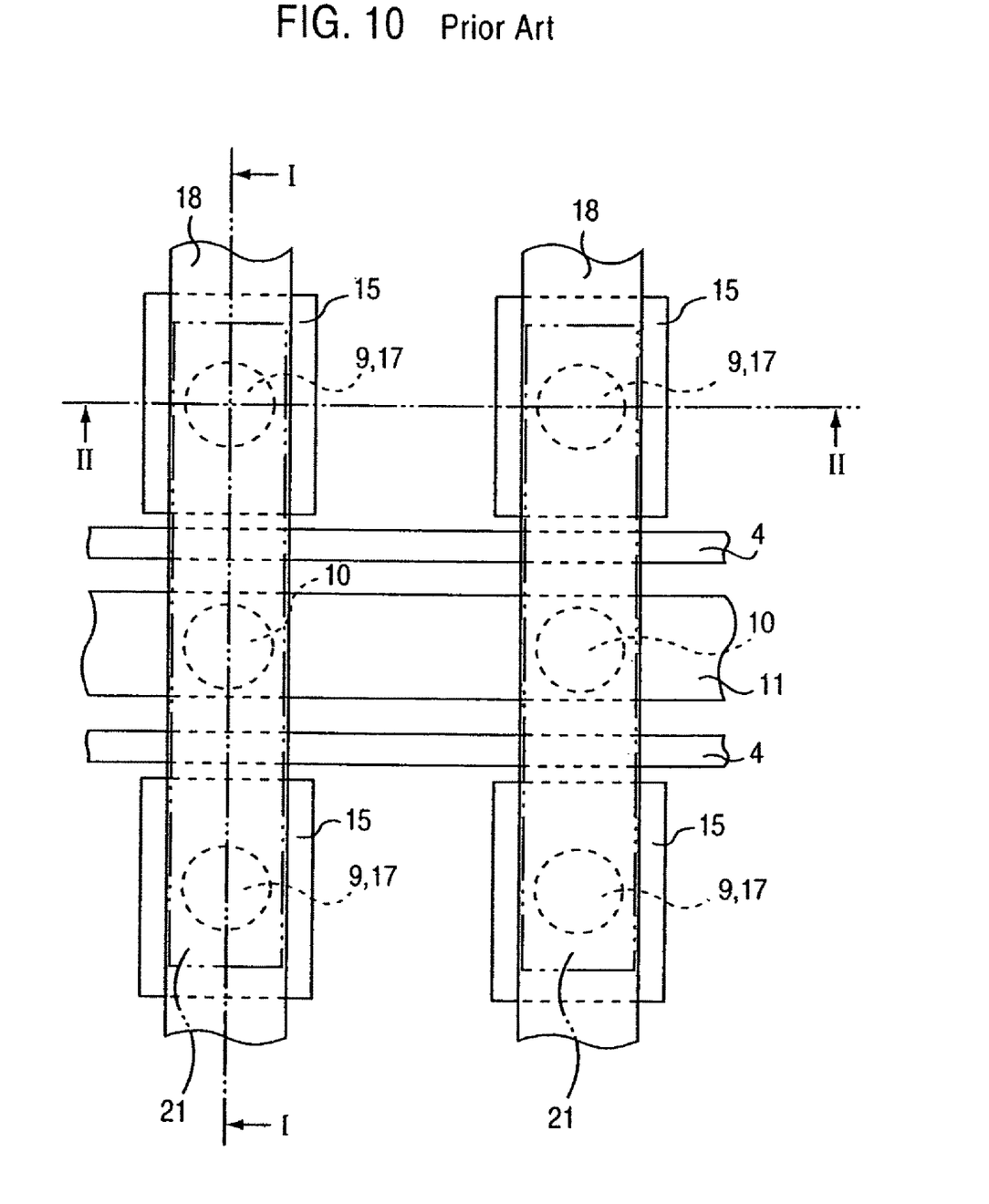
FIG. 10 is a layout illustrating a configuration of a semiconductor device (ferroelectric memory) of the prior art.
Figure 11:
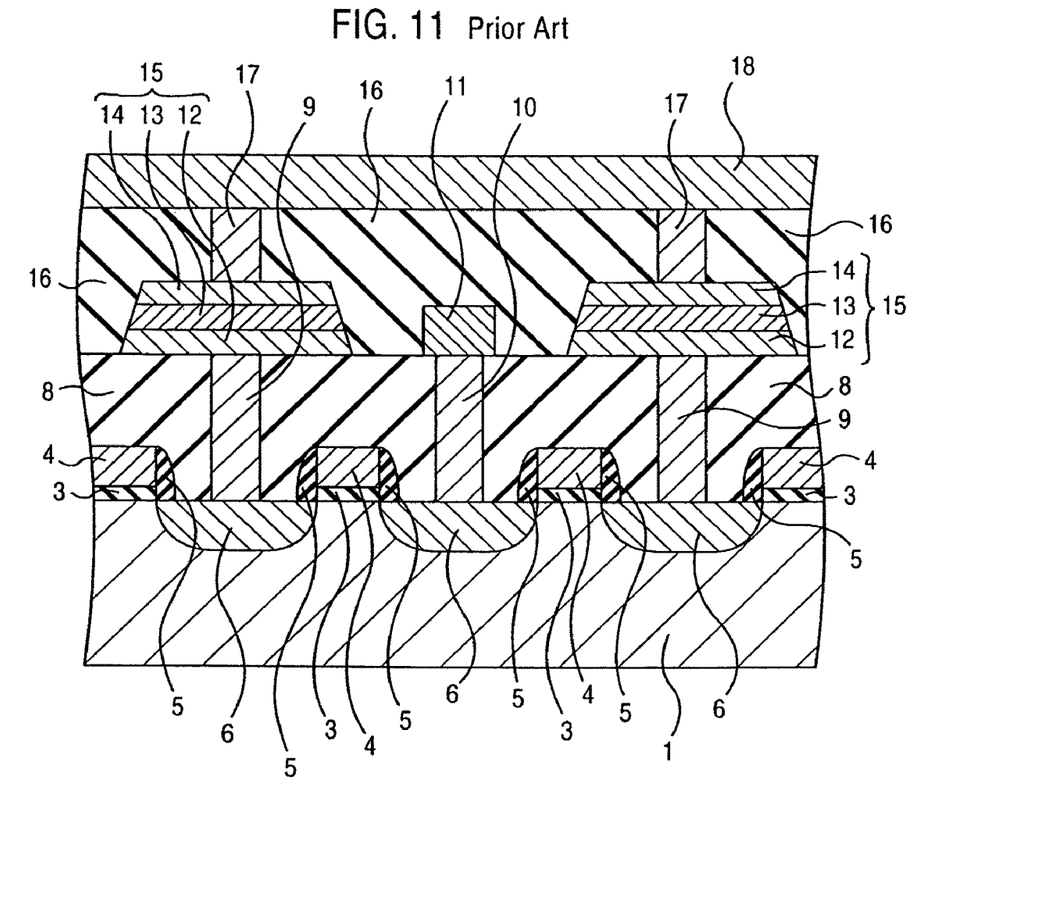
FIG. 11 is a sectional view taken along the I-I line in FIG. 10.
Figure 12:
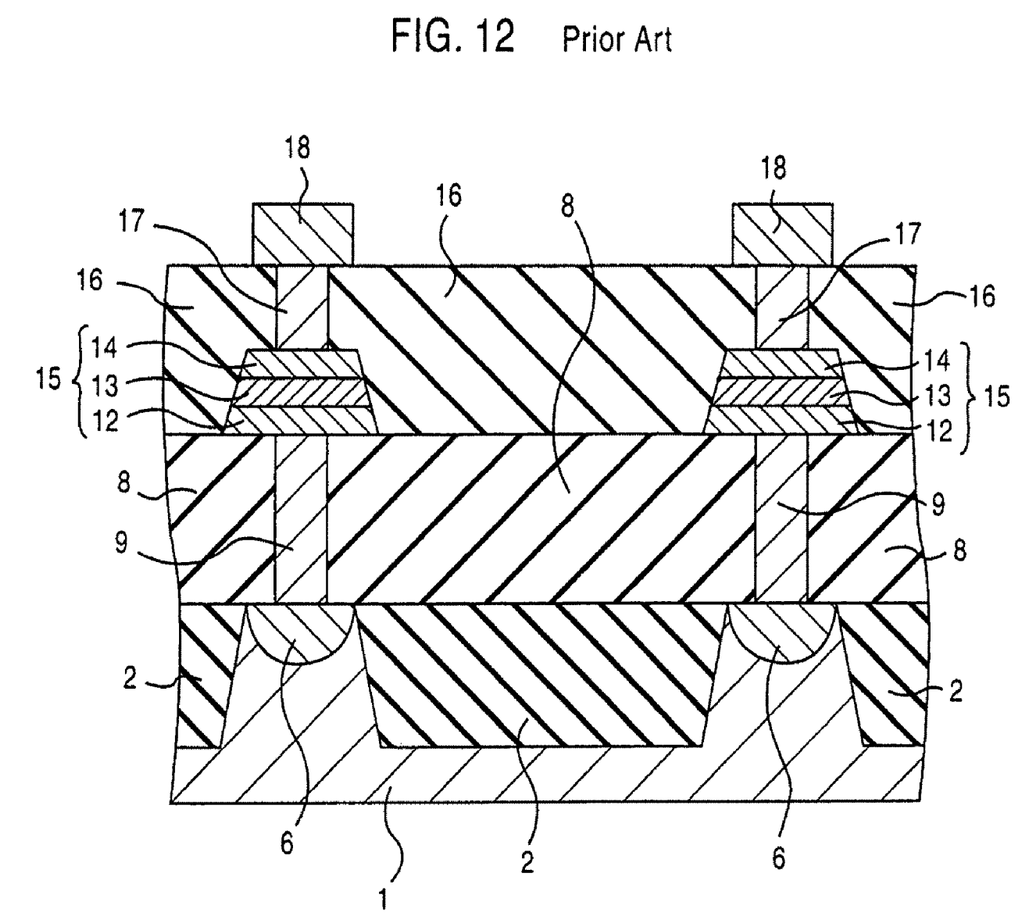
FIG. 12 is a sectional view taken along the II-II line in FIG. 10.

Based on the above observational study, the present inventor has found that the adhering tendency of deposits to the sidewalls at the time of the high-temperature simultaneous etching depends not only on etching conditions but also on two factors in view of shape, namely the side length of the capacitor and the distance between the capacitors. From a different perspective, in the case of a layout of a conventional capacitor, as shown in FIG. 10 to FIG. 12, the distances between adjacent capacitors are different between those in the longitudinal direction and those in the lateral direction. This causes a difference between the amount of deposits on the longer sidewall and that on the shorter sidewall, making it difficult to adjust the etching conditions so as to reduce the leakage current while preventing the damages.

The present inventor, therefore, performed calculations to obtain the relation between the deposits adhering tendency and the shape factors by quantifying the tendency with leakage current densities of the capacitor. The calculation results are shown in Table. 1 below, where a leakage current quotient L is defined as "(side length of capacitor)/(distance between capacitors)".

TABLE 1

| | | | |
|---|---|---|---|
| capacitor side length (A) (μm) | 0.8 | 1.0 | 1.5 |
| Distance between capacitors (B) (μm) | 0.7 | 0.5 | 0.5 |
| Leakage current quotient L: (A)/(B) | 1.1 | 2.0 | 3.0 |
| 6 V leakage current density (A/cm$^2$) | $1 \times 10^{-1}$ | $1 \times 10^{0}$ | $1 \times 10^{2}$ or above |

As shown in Table 1, a relation between the leakage current quotient L and the leakage current density of the capacitor is confirmed. The larger the former is, the higher the latter increases.

Based on these findings, the present inventor has devised the present invention as will be described hereinbelow.

According to a first aspect of the present invention, a semiconductor device includes a semiconductor substrate, a plurality of transistors formed on the surface of the semiconductor substrate, an interlayer insulating film for covering the transistors, and a plurality of ferroelectric capacitors formed over the interlayer insulating film. An electrode of each of the plurality of the ferroelectric capacitors is connected to one of a source or a drain of the transistor via a first contact plug. The plurality of ferroelectric capacitors are arranged in an array. Each of the plurality of ferroelectric capacitor has substantially a rectangular planar shape. The ratio between the length of a long side of the rectangular shape and the distance between the long sides of two ferroelectric capacitors adjacent to each other substantially coincides with the ratio between the length of a short side of the rectangular shape and the distance between the short sides of two ferroelectric capacitors adjacent to each other.

According to a second aspect of the present invention, a semiconductor device includes a semiconductor substrate, a plurality of transistors formed over a surface of the semiconductor substrate, an interlayer insulating film for covering the transistors, a plurality of ferroelectric capacitors formed over the interlayer insulating film, and a plurality of bit lines formed over the interlayer insulating film. An electrode of each of the plurality of ferroelectric capacitors is connected to one of a source or a drain of the transistor via a first contact plug. Each of the plurality of bit lines is connected to the other one of the source or the drain of the transistor via a second contact plug. The plurality of ferroelectric capacitors are arranged in an array. The first contact plug is located at substantial central point of a minimal rectangular shape (including a square shape) made by four ferroelectric capacitors out of the plurality of ferroelectric capacitors.

According to a third aspect of the present invention, a semiconductor device includes a semiconductor substrate, a plurality of transistors formed on a surface of the semiconductor substrate, an interlayer insulating film for covering the transistors, a plurality of ferroelectric capacitors formed over the interlayer insulating film, and a plurality of bit lines formed over the interlayer insulating film. An electrode of each of the plurality of ferroelectric capacitors is connected to one of a source or a drain of the transistor via a first contact plug. Each of the plurality of bit lines is connected to the other one of the source or the drain of the transistor via a second contact plug. The plurality of ferroelectric capacitors are arranged in an array. Each of the ferroelectric capacitors has substantially a rectangular planar shape. The second contact plug is located between respective long sides of two adjacent ferroelectric capacitors out of the plurality of ferroelectric capacitors.

According to a fourth aspect of the present invention, a semiconductor device includes a semiconductor substrate, a plurality of transistors formed on a surface of the semiconductor substrate, an interlayer insulating film for covering the transistors, and a plurality of ferroelectric capacitors formed over the interlayer insulating film. An electrode of each of the plurality of ferroelectric capacitors is connected to one of a source or a drain of the transistor via a first contact plug. Each of the ferroelectric capacitors has substantially a circular planar shape.

DETAILED DESCRIPTION OF THE PREFERRED EMBODIMENTS

Figure 1:
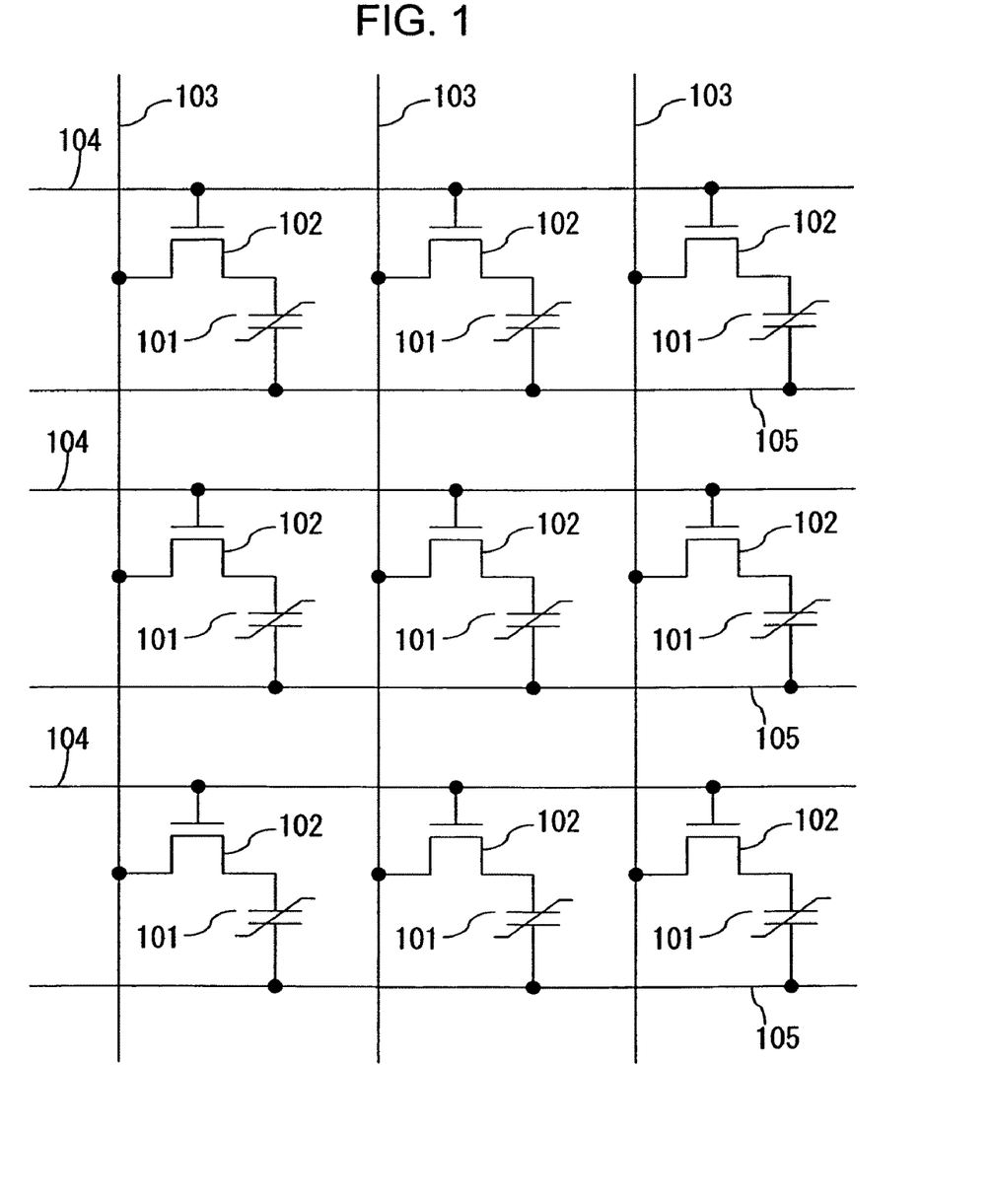
FIG. 1 is a circuit diagram showing a configuration of a memory cell array of a ferroelectric memory (semiconductor device) according to embodiments of the present invention.

Hereinafter, some embodiments of the present invention will specifically be described with reference to the accompanying drawings. FIG. 1 is a circuit diagram showing a configuration of a memory cell array of a ferroelectric memory (semiconductor device) according to the embodiments of the present invention.

In the memory cell array, there are provided a plurality of bit lines 103 extending in one direction, a plurality of word lines 104 and plate lines 105 extending in the direction orthogonal to the extending direction of the bit lines 103. Additionally, a plurality of memory cells of the ferroelectric memory according to the present embodiments are arranged in an array in a manner so as to align with grids formed by the bit lines 103, word lines 104, and plate lines 105. In each memory cell, there are provided a ferroelectric capacitor 101 and a MOS transistor 102.

A gate of the MOS transistor 102 is connected to the word line 104. One of a source or a drain of the MOS transistor 102 is connected to the bit line 103. The other source or drain is connected to one electrode of the ferroelectric capacitor 101. The other electrode of the ferroelectric capacitor 101 is connected to the plate line 105. Incidentally, each of word lines 104 and plate lines 105 is shared by the plurality of MOS transistor 102 aligned in the same directions as of the word line 104 and the plate line 105 respectively. Similarly, each bit line 103 is shared by the plurality of MOS transistor 102 aligned in the same direction as of the bit line 103. The direction in which the word line 104 and the plate line 105, and the bit line 103 extend may be referred to as a longitudinal direction and a lateral direction respectively.

In the memory cell array of the ferroelectric memory configured as described before, data are stored in accordance with the polarization state of a ferroelectric film provided in the ferroelectric capacitor 101.

First Embodiment

Figure 2:
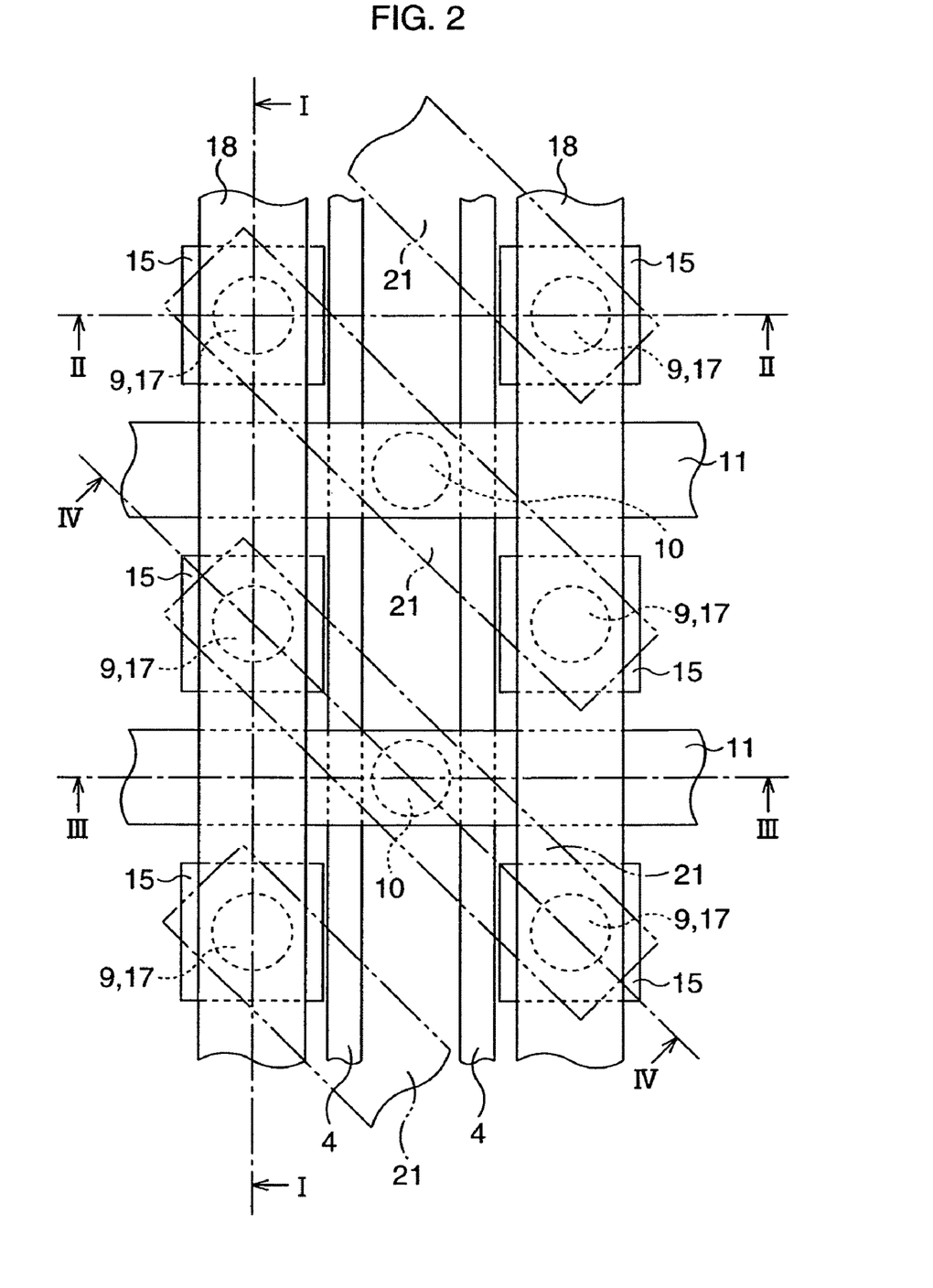
FIG. 2 is a layout illustrating a configuration of a semiconductor device (ferroelectric memory) according to a first embodiment of the present invention.
Figure 3:
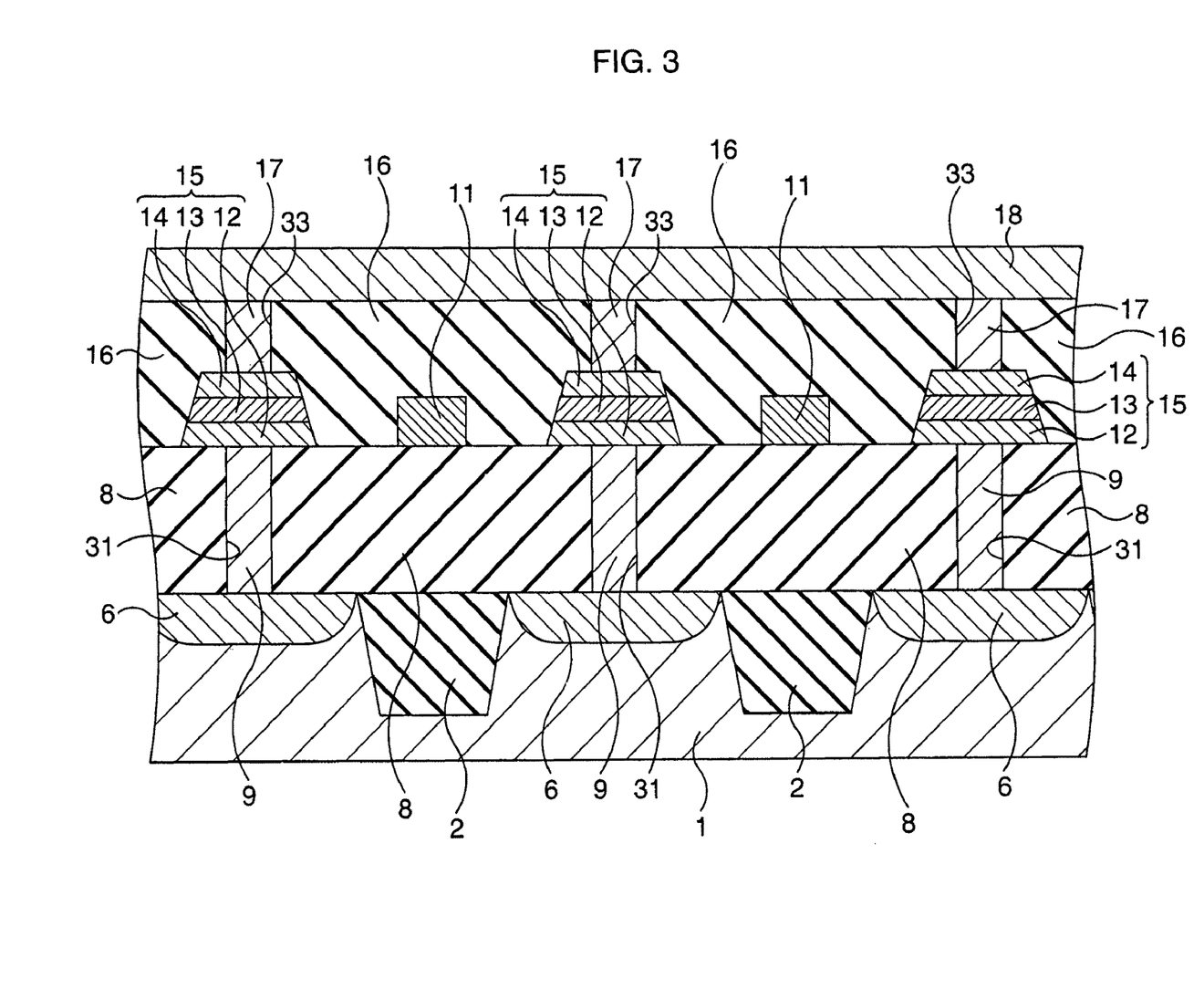
FIG. 3 is a sectional view taken along the I-I line in FIG. 2.
Figure 4A:
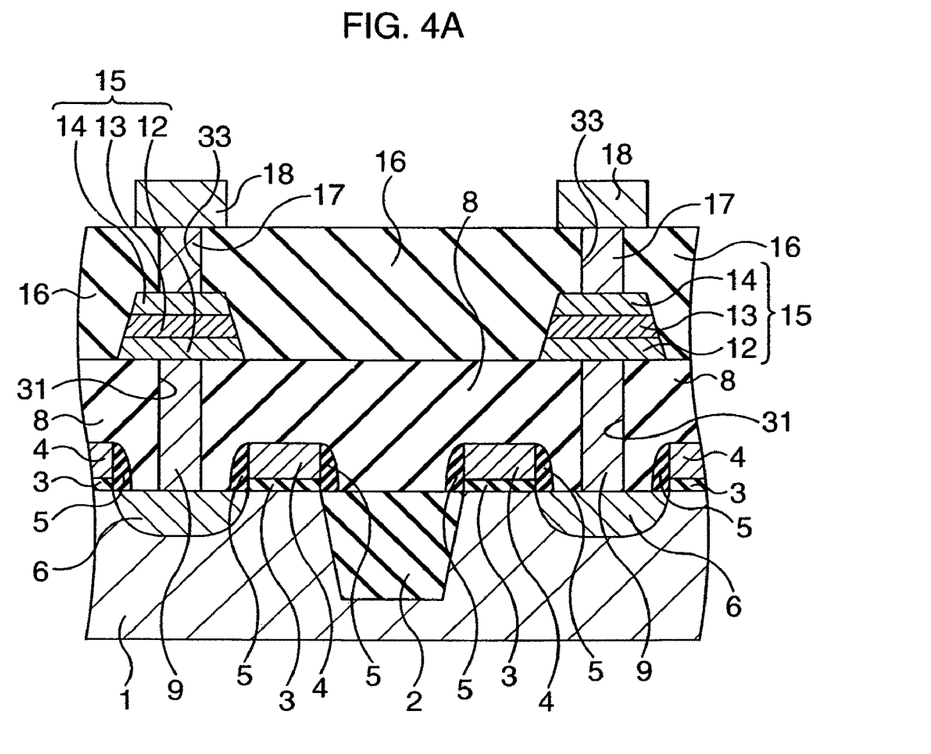
FIG. 4A is a sectional view taken along the II-II line in FIG. 2.
Figure 4B:
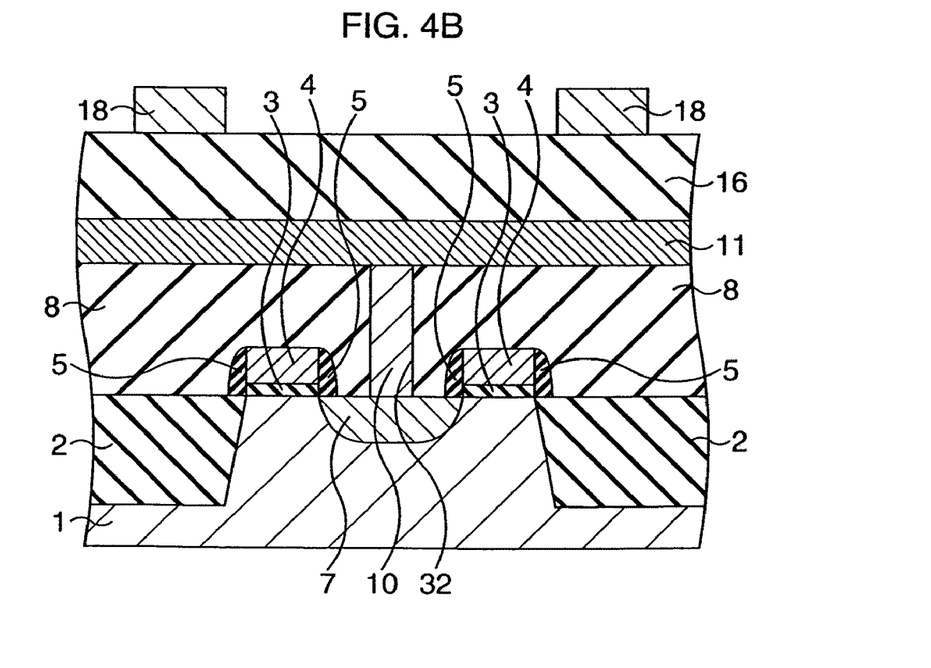
FIG. 4B is a sectional view taken along the III-III line in FIG. 2.
Figure 5:
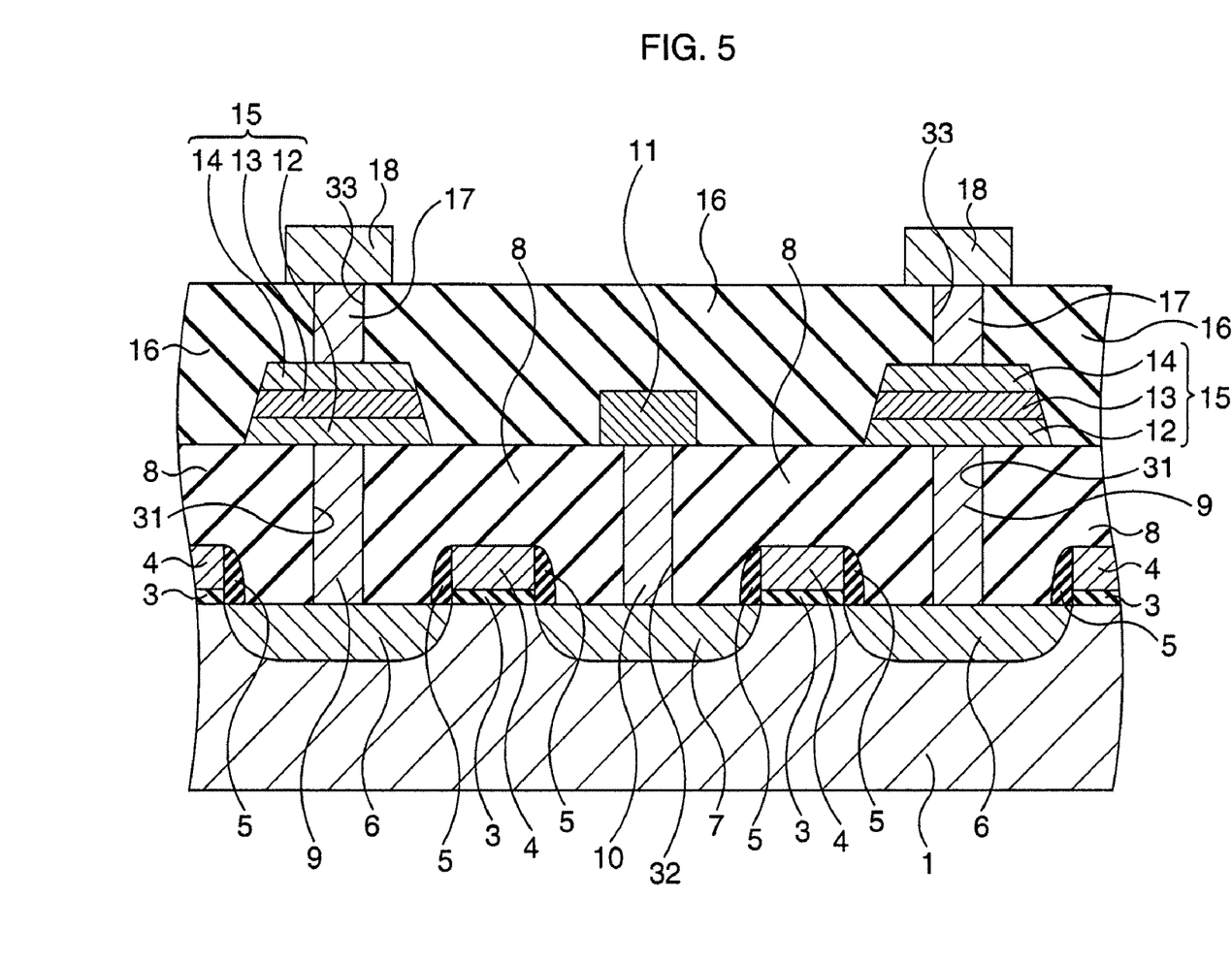
FIG. 5 is a sectional view taken along the IV-IV line in FIG. 2.

Hereinbelow, a first embodiment of the present invention will be described. FIG. 2 is a layout illustrating a configuration of a semiconductor device (ferroelectric memory) according to the first embodiment of the present invention, in which a straight line connecting the source and the drain of the transistor extends in a direction substantially inclined at an angle of 45 degrees to the longitudinal and lateral directions of the array constituted by the plurality of ferroelectric capacitors, also in which the line connecting the source and the drain of one of the two transistors substantially coincides with the line connecting the source and the drain of the other one of the two transistors. FIG. 3 is a sectional view taken along the I-I line in FIG. 2. FIG. 4A is a sectional view taken along the II-II line in FIG. 2. FIG. 4B is a sectional view taken along the III-III line in FIG. 2. FIG. 5 is a sectional view taken along the IV-IV line in FIG. 2.

In the present embodiment, as shown in FIG. 2 to FIG. 5, element isolation insulating films 2 for isolating a plurality of element regions 21 extending in one direction are formed for example by STI (Shallow Trench Isolation) method on the surface of a semiconductor substrate 1 such as a silicon substrate or the like. In addition, gate electrodes 4 (word lines)

inclining at an angle of 45 degrees to the extending direction of the element regions 21 are formed via gate insulating films 3 on the semiconductor substrate 1. Each element region 21 is divided into three portions by the two gate electrodes 4. Further, on the surface of the semiconductor substrate 1 within the element region 21, impurity diffused layers 6, 7 are formed in a self-aligned manner with the gate electrodes 4. The impurity diffused layer 7 is formed in a central portion of the element region 21 divided into three portions by the two gate electrodes 4, and the impurity diffused layers 6 are formed in both end portions of the element region 21. Furthermore, on the sides of each gate electrode 4, sidewalls 5 are formed. In the manner as described above, a MOS transistor is configured. This MOS transistor corresponds to the MOS transistor 102 in FIG. 1.

On the surface of the semiconductor substrate 1, there is formed an interlayer insulating film 8 so as to cover the MOS transistors. In the interlayer insulating film 8, there are formed contact holes 31 reaching through to the impurity diffused layers 6 and contact holes 32 reaching through to the impurity diffused layers 7. In each contact hole 31, a W plug 9 is embedded via a barrier metal film, and in each contact hole 32, a W plug 10 is embedded via the barrier metal film.

On the interlayer insulating film 8, there are formed bit lines 11 extending orthogonal to the gate electrodes 4, each bit line 11 being connected to the W plug 10. Further on the interlayer insulating film 8, there are formed ferroelectric capacitors 15 each composed of a lower electrode 12, a capacitor insulating film 13, and an upper electrode 14. The lower electrode 12 is connected to the W plug 9. The capacitor insulating film 13 is the ferroelectric film made of PZT (Pb (Zr, Ti) O$_3$) or the like. The ferroelectric capacitor 15 corresponds to the ferroelectric capacitor 101 in FIG. 1.

Here, each ferroelectric capacitor 15 has substantially a square planar shape. The distances between those ferroelectric capacitors 15 adjacent to each other in the extending direction of the gate electrodes 4 coincide substantially with the distances between those ferroelectric capacitors 15 adjacent to each other in the extending direction of the bit lines 11.

On the interlayer insulating film 8, there is formed an interlayer insulating film 16 for covering the bit lines 11 and the ferroelectric capacitors 15. In the interlayer insulating film 16, there are formed contact holes 33 reaching through to the upper electrodes 14. In each contact hole 33, a W plug 17 is embedded via a barrier metal film (unshown). On the interlayer insulating film 16, there are formed plate lines 18 extending parallel to the gate electrodes 4, each plate line 18 being connected to the W plug 17.

Over those, unshown upper wirings and so forth are formed to thereby configure the ferroelectric memory.

In the ferroelectric memory according to the first embodiment configured as described above, the W plugs 10, which connect the impurity diffused layers 7 and the bit lines 11, are formed not between the adjacent ferroelectric capacitors 15 in the extending direction of the plate lines 18 irregularly but between the adjacent plate lines 18. Therefore, the distances between those ferroelectric capacitors 15 adjacent to each other in the extending direction of the plate lines 18 can be narrowed as compared to the prior one. Also, the distances between those ferroelectric capacitors 15 adjacent to each other in the extending direction of the bit lines 11 can be widened as compared to the prior one. In other words, it is allowed to substantially equalize the distances between the ferroelectric capacitors 15 extending in the above both directions. Further, in the present embodiment, each ferroelectric capacitor 15 has substantially a square planar shape while essentially equalizing the distances between thereof, so that the leakage current quotients L shown in Table 1 are essentially equalized for each side. On this account, in the manufacturing process thereof, the possible sidewall deposits adhering to the ferroelectric capacitor 15 are essentially equalized in amount for each side. As a result, the amount of the sidewall deposits can be controlled as like as the damages of ferroelectric film such as the PZT film or the like composing the capacitor insulating film 13 can be controlled while reducing the leakage current, by adjusting the etching conditions.

Incidentally, the ferroelectric capacitor 15 preferably has a square planar shape, but not necessarily to do. Also, the distances between ferroelectric capacitors 15 are preferably equalized, but not necessarily to be. However, in any case, it is preferable that the leakage current quotients L [(side length of capacitor)/(distance between capacitors)] are substantially equalized. Preferably, for example, when the ferroelectric capacitor 15 has a rectangular planar shape, the distances between the short sides of the adjacent ferroelectric capacitors 15 are made smaller than those of the long sides of the adjacent ferroelectric capacitors 15, so that the leakage current quotients L are substantially equalized.

Second Embodiment

Figure 6:
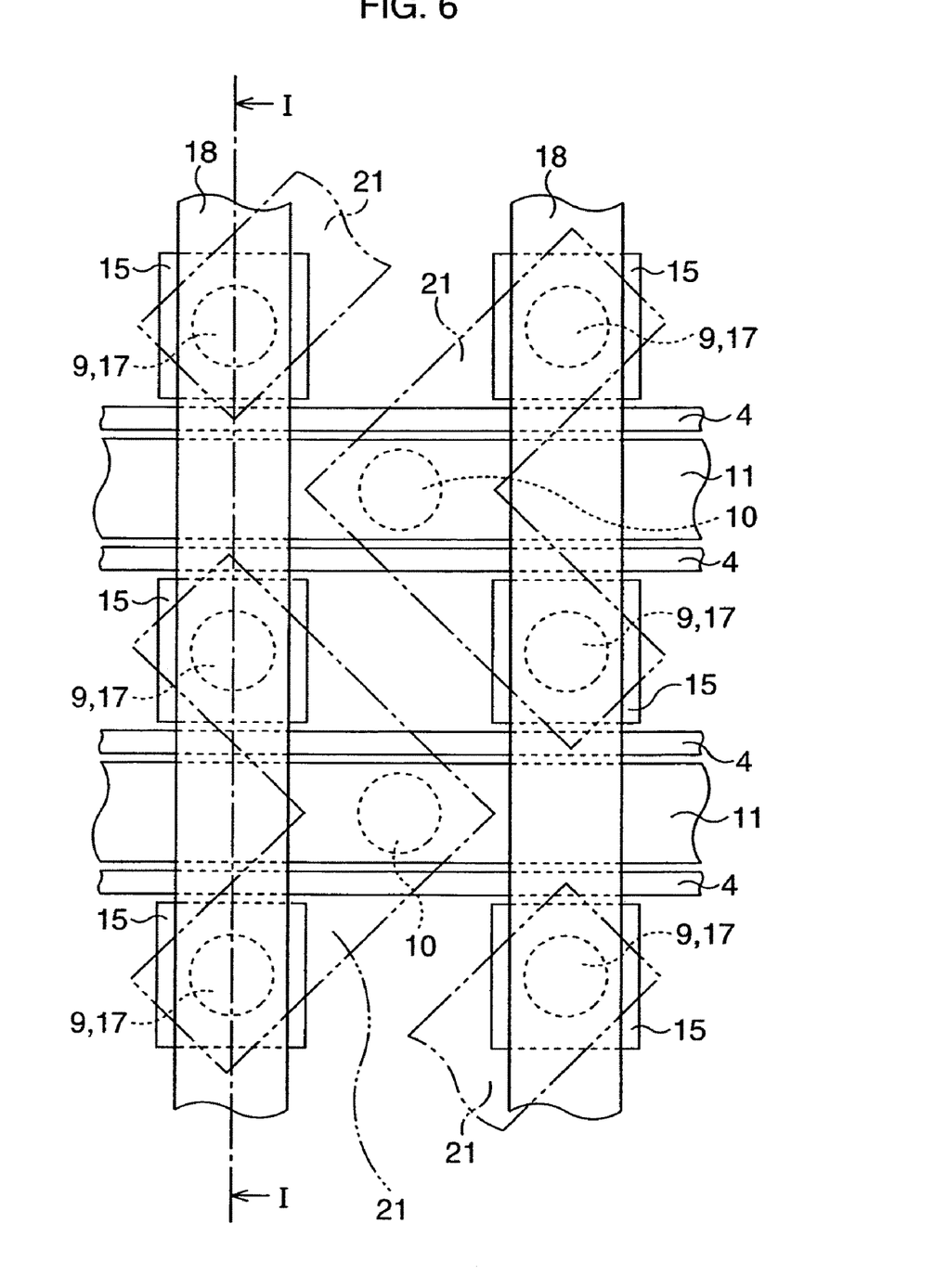
FIG. 6 is a layout illustrating a configuration of a semiconductor device (ferroelectric memory) according to a second embodiment of the present invention.
Figure 7:
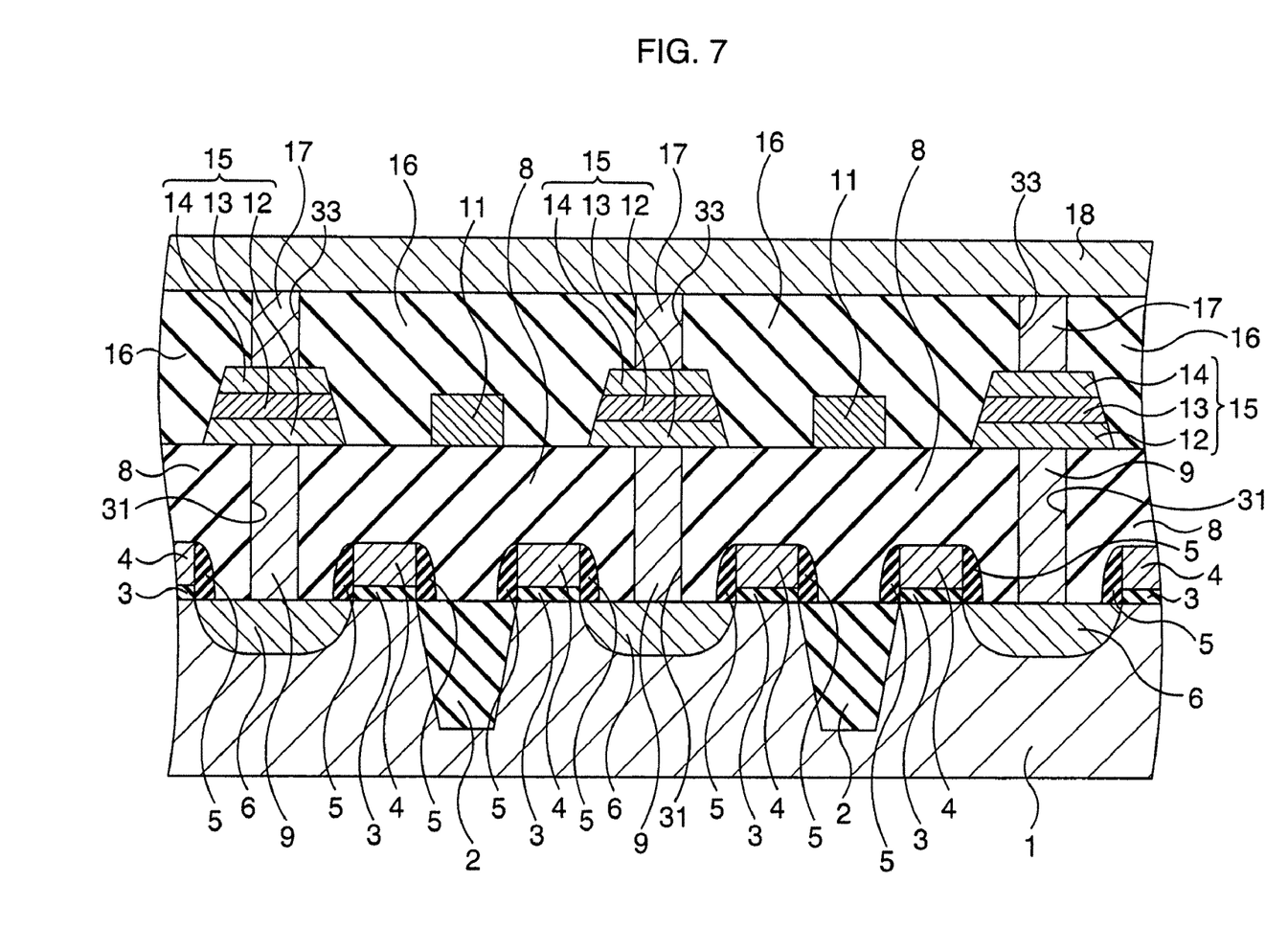
FIG. 7 is a sectional view taken along the I-I line in FIG. 6.

Subsequently, a second embodiment of the present invention will be described. FIG. 6 is a layout illustrating a configuration of a semiconductor device (ferroelectric memory) according to the second embodiment of the present invention, in which the line connecting the source and the drain of one of the two transistors is substantially orthogonal to the line connecting the source and the drain of the other one of the two transistors. FIG. 7 is a sectional view taken along the I-I line in FIG. 6.

In the present embodiment, differently from the first embodiment, an element region 21 has a dogleg planar shape and the extending direction of a gate electrode 4 (word line) is parallel to a bit line 11 and orthogonal to a plate line 18. Two impurity diffused layers 6 provided in the same element region 21 are connected to lower electrodes 12 of ferroelectric capacitors 15 of which upper electrodes 14 are connected to the same plate line 18.

Also, in this second embodiment configured as described above, the same effects as of the first embodiment can be obtained.

Third Embodiment

Figure 8:
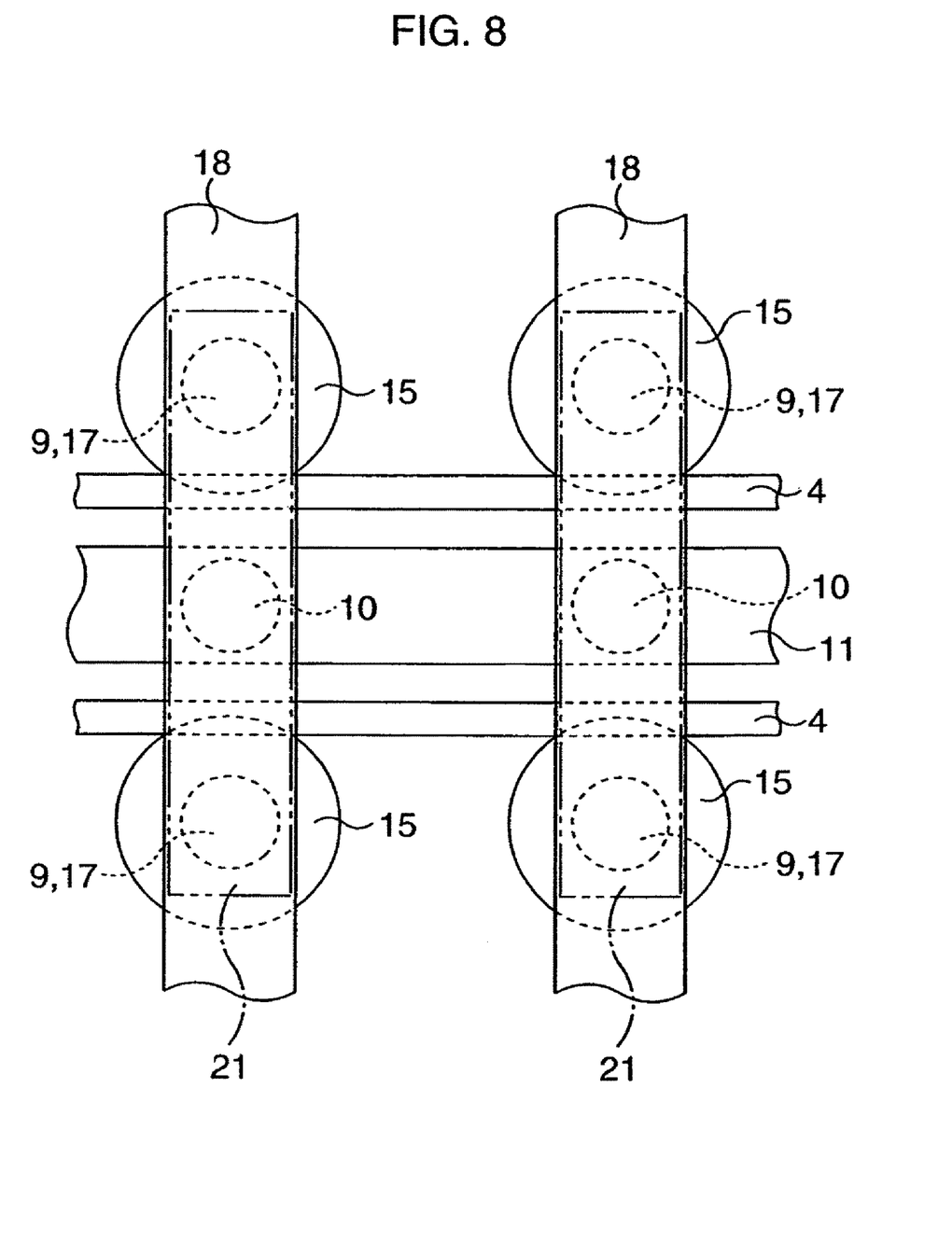
FIG. 8 is a layout illustrating a configuration of a semiconductor device (ferroelectric memory) according to a third embodiment of the present invention.

Subsequently, a third embodiment of the present invention will be described. FIG. 8 is a layout illustrating a configuration of a semiconductor device (ferroelectric memory) according to the third embodiment of the present invention. In the present embodiment, a ferroelectric capacitor 15 has a circular planar shape in comparison with that of the prior layout shown in FIG. 10 to FIG. 12.

In the third embodiment as described above, in the manufacturing process thereof, deposits generally become difficult to adhere to the sidewall 5 of the ferroelectric capacitor 15 at the time of the high-temperature simultaneous etching, enabling to reduce leakage current. Whereas, the sidewall deposits have an advantage of preventing a capacitor insulating film 13 from damages as mentioned before. Preferably, therefore, in the high-temperature simultaneous etching, etching conditions are adjusted so that the damages of the capacitor insulating film 13 are prevented. At the time of the high-temperature simultaneous etching, in the present embodiment, the etching progresses equally all over the peripheries of the ferroelectric capacitor 15, whereby causing no large local damage.

Fourth Embodiment

Figure 9:
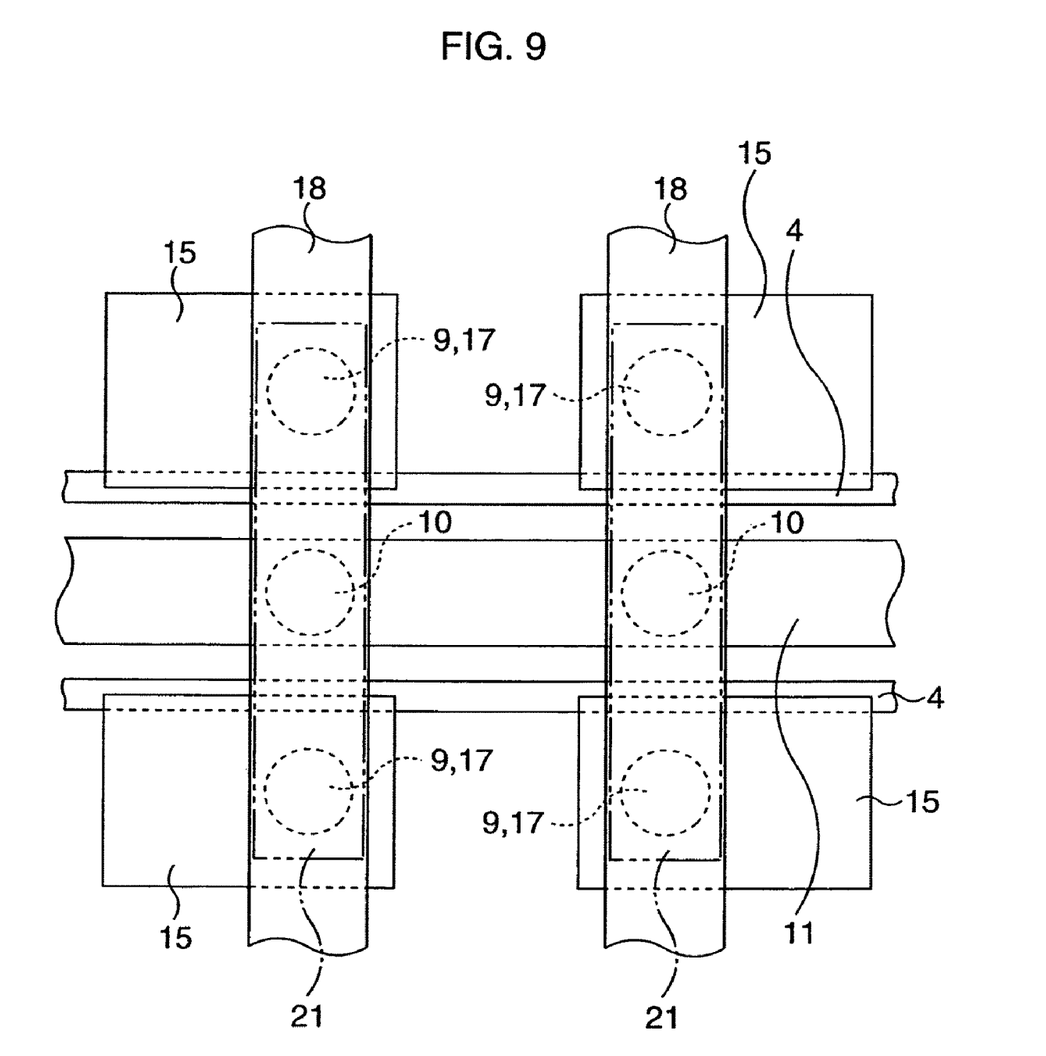
FIG. 9 is a layout illustrating a configuration of a semiconductor device (ferroelectric memory) according to a fourth embodiment of the present invention.

Subsequently, a fourth embodiment of the present invention will be described. FIG. 9 is a layout illustrating a configuration of a semiconductor device (ferroelectric memory) according to the fourth embodiment of the present invention. In the present embodiment, a ferroelectric capacitor 15 has a rectangular planar shape with the same yet mutually replaced long sides and short sides as of the prior art shown in FIG. 10 to FIG. 12. Specifically, the long sides of the ferroelectric capacitor 15 extend alongside a bit line 11, and the short sides of the ferroelectric capacitor 15 extend alongside a plate line 18, and there are placed the W plugs 10, which connect the impurity diffused layers 7 and the bit lines 11, between the long sides of the two ferroelectric capacitors 15. Moreover, the distances between the long sides are larger than those between the short sides. Consequently, the ferroelectric capacitors 15 are arranged so that the leakage current quotients L are essentially equalized over the long sides and the short sides.

In the fourth embodiment configured as described above, it is also possible to reduce the leakage current while preventing damages of a ferroelectric film simply by adjusting the etching conditions in that the sidewall deposits are equalized essentially over the long sides and the short sides.

Note that in order to manufacture the ferroelectric memory according to the above-described embodiments, in view of process flow such as film forming and the like, no specific change is required for example in the process of manufacturing the ferroelectric memory of the prior art shown in FIG. 10 to FIG. 12. What has to be done is only to pattern and so forth in conformity with the layout shown in FIG. 2 and the like.

According to the present invention, the amounts of the sidewall deposits adhering to the sidewalls of the ferroelectric capacitors are essentially equalized all over the peripheries thereof, whereby allowing to avoid such a phenomenon that the leakage current increases at one place while causing a larger damage at the other place. Consequently, the reduction of the leakage current can be realized with ease together with the prevention of the local damages by simply adjusting the etching conditions.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:
1. A semiconductor device comprising:
a semiconductor substrate;
a plurality of transistors formed on a surface of said semiconductor substrate;
an interlayer insulating film for covering said transistors;
a plurality of ferroelectric capacitors formed over said interlayer insulating film, an electrode of each of said plurality of ferroelectric capacitors being connected to one of a source or a drain of said transistor via a first contact plug; and
a plurality of bit lines formed over said interlayer insulating film, each of said plurality of bit lines being connected to the other one of the source or the drain of said transistor via a second contact plug,
wherein said plurality of ferroelectric capacitors are arranged in an array,
wherein each of said plurality of ferroelectric capacitor has substantially a square planar shape,
wherein distances between adjacent ferroelectric capacitors are substantially constant in any of longitudinal directions and in any of latitudinal directions of the array constituted by said ferroelectric capacitors,
wherein the distances in the longitudinal direction are the same as the distances in the latitudinal direction, and
wherein said plurality of bit lines extends to a direction parallel to a surface of the semiconductor substrate, and extends to a direction parallel or perpendicular to two sides of said square planar shape in plan view.

2. The semiconductor device according to claim 1, wherein sidewall deposits adhere to all of a sidewall of said plurality of ferroelectric capacitors.

3. A semiconductor device comprising:
a semiconductor substrate;
a plurality of transistors formed on a surface of said semiconductor substrate;
an interlayer insulating film for covering said transistors;
a plurality of ferroelectric capacitors formed over said interlayer insulating film, an electrode of each of said plurality of ferroelectric capacitors being connected to one of a source or a drain of said transistor via a first contact plug; and
a plurality of bit lines formed over said interlayer insulating film, each of said plurality of bit lines being connected to the other one of the source or the drain of said transistor via a second contact plug;
wherein said plurality of ferroelectric capacitors are arranged in an array,
wherein the second contact plug is located at a substantially central point of a minimal rectangular shape made by four ferroelectric capacitors out of said plurality of ferroelectric capacitors,
wherein each of said ferroelectric capacitor has substantially a square planar shape,
wherein distances between adjacent ferroelectric capacitors are substantially constant in any of longitudinal directions and in any of latitudinal directions of the array constituted by said ferroelectric capacitors,
wherein the distances in the longitudinal direction are the same as the distances in the latitudinal direction, and
wherein said plurality of bit lines extends to a direction parallel to a surface of the semiconductor substrate, and extends to a direction parallel or perpendicular to two sides of said square planar shape in plan view.

4. The semiconductor device according to claim 3, wherein sidewall deposits adhere to all of a sidewall of said plurality of ferroelectric capacitors.

* * * * *